United States Patent
Segalen

(10) Patent No.: US 7,687,726 B2
(45) Date of Patent: Mar. 30, 2010

(54) ELECTROMAGNETIC CONTAINMENT MODULE FOR ELECTRONIC COMPONENTS

(75) Inventor: Remi Segalen, Plougastel-Daoulas (FR)

(73) Assignee: Thales, Neuilly sur Seine (FR)

(*) Notice: Subject to any disclaimer, the term of this patent is extended or adjusted under 35 U.S.C. 154(b) by 0 days.

(21) Appl. No.: 12/408,976

(22) Filed: Mar. 23, 2009

(65) Prior Publication Data

US 2009/0237908 A1    Sep. 24, 2009

(30) Foreign Application Priority Data

Mar. 21, 2008  (FR) ................................. 08 01577

(51) Int. Cl.
*H05K 9/00*    (2006.01)
(52) U.S. Cl. ....................................... 174/377
(58) Field of Classification Search ................. 174/377, 174/382; 361/816, 818, 800, 752
See application file for complete search history.

(56) References Cited

U.S. PATENT DOCUMENTS 7,368,668 B2 * 5/2008 Ren et al. .................... 174/382
7,626,127 B2 * 12/2009 Kakinoki .................... 174/382
2009/0308653 A1 * 12/2009 Wu ............................. 174/377

FOREIGN PATENT DOCUMENTS

| EP | 0503200 A | 9/1992 |
|----|-----------|--------|
| GB | 2272580 A | 5/1994 |
| JP | 55150255 A | 11/1980 |
| WO | WO-03/049519 A | 6/2003 |

* cited by examiner

*Primary Examiner*—Phuong K Dinh
(74) *Attorney, Agent, or Firm*—Darby & Darby

(57) ABSTRACT

The present invention relates to an electromagnetic containment module. The module includes a metal casing sealed by a metal cover. The module contains a printed circuit arranged flat in the bottom of the casing, and an input/output line leaving the printed circuit via one of its edges to pass perpendicularly through a wall of the casing. A cylinder of hollow axis is arranged on the internal face of this wall, the axis of the cylinder being substantially perpendicular to the wall and the input/output line passing through the cylinder substantially along its axis. The cover includes a notch, the bottom of which has the form of a half-cylinder of the same diameter as the cylinder, the cylinder fitting substantially without play in the notch when the cover is closed, so as to electromagnetically contain the portion of the input/output line situated in the module between the edge of the printed circuit and the wall of the casing.

10 Claims, 2 Drawing Sheets

ELECTROMAGNETIC CONTAINMENT MODULE FOR ELECTRONIC COMPONENTS

Figure 1:
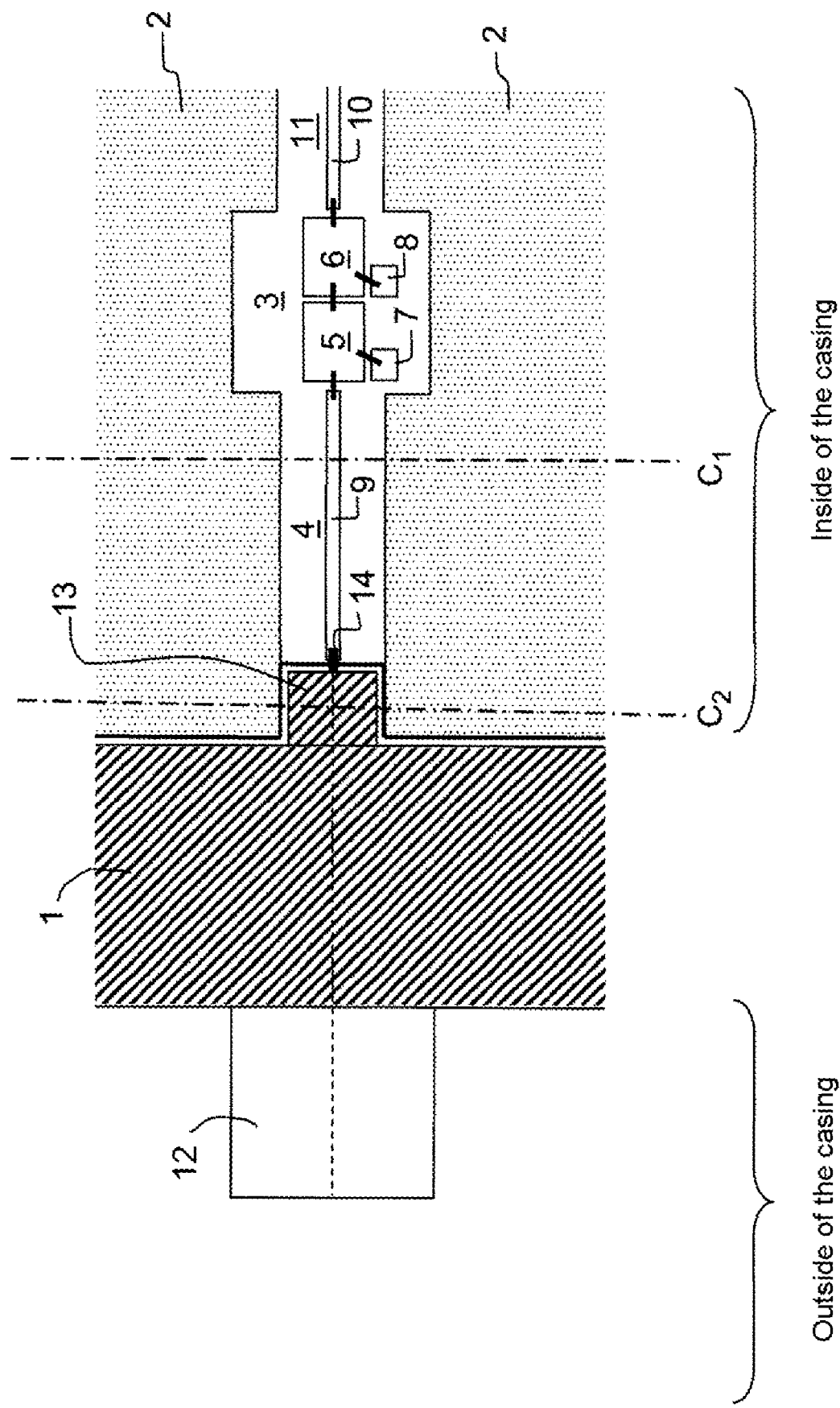

The present application claims the benefit of French Patent Application No. 0801577, filed Mar. 21, 2008, which is hereby incorporated by reference in its entirety.

The present invention relates to a containment module for electronic components. It applies for example to the field of microwave electronics.

The complex subsystems for processing the microwave signal from a radar require basic functions to be cascaded in modules with a very high level of integration. However, the integration technology should not degrade the fundamental performance characteristics of these basic functions. The high level of integration of the modules notably implies a strong insulation between the various elements of the microwave processing subsystem, in order to limit the electromagnetic interference phenomena, and within a very wide frequency band.

Current solutions conventionally propose using shielding to contain the functional blocks and the transmission lines that form the circuit that implements the processing subsystem. For example, metal casings according to the prior art include cavities hollowed out from the metal body of the casing, the cavities forming cells and channels interlinking the cells. The cells accommodate the functional blocks implemented by more or less complex electronic components. Bias and control voltages arrive at the functional blocks in the cells via openings hollowed out in the bottom of the casing. The channels accommodate the transmission lines that interlink the functional blocks. The casing is sealed by a metal cover. With a relatively small thickness compared to the thickness of the casing, but needing to be in good electrical contact with all the separating partitions between the cavities, the cover is welded to the casing at various points of the casing, not only at the edges, by a laser-welding technology for example. In practice, joining by the edges would not provide an adequate electrical contact with all the separating partitions between the cavities, notably because of the deformations of the cover which is too thin. A major drawback of this solution is the parcelling of the circuit, which is dispersed over a number of substrates divided between the cells, making the industrial engineering of the module as a whole complicated and therefore costly. The electrical discontinuities due to the breaks in substrate between the functional blocks also limit the performance characteristics of the processing subsystem. Furthermore, the openings hollowed out in the bottom of the casing to bring the bias and control voltages to the functional blocks further complicate the machining of the casing. Finally, with the functional blocks being difficult to access because they are set in the cells that are sealed by welding, maintenance of the module is rather difficult.

Other current solutions also propose using shielding to contain the functional blocks and the transmission lines, but by hollowing out cavities from the body of a thicker metal cover rather than from a casing. Thus, the functional blocks and the transmission lines that form the circuit that implements the processing subsystem can be assembled on one and the same substrate, which facilitates the industrial engineering of the circuit without truly complicating the machining of the casing-cover assembly. To ensure the continuity of the shielding between the functional blocks and the transmission lines, metal vias link the bottom of the metal casing to the metal cover by passing through the circuit. Being thicker, the cover is not deformed and it can therefore be joined to the casing by the edges only, while ensuring an adequate electrical contact with the vias to maintain the continuity of the shielding. A major drawback of this solution arises from the fact that the circuit is not supported by the casing itself, but by a substrate inserted into the casing. Now, the substrate inserted into the casing necessarily causes a slot to appear between the substrate and the casing, a slot that extends all along the edges of the substrate. Also, this slot should be passed through by the line or lines conveying one or more input signals into the module and by the output line or lines conveying one or more signals out of the module. Also, two input/output lines share one and the same volume formed by the slot, so they are not contained relative to each other. Furthermore, since the surface of the cover needs to be inscribed within the surface of the substrate to be able to exert an adequate pressure on the metal vias that pass through the substrate, the slot is visible even from the outside of the module, causing real electromagnetic leaks to the outside of the module at the level of the input and output connectors of the module. This is one of the technical problems that the present invention seeks to resolve.

The aim of the invention is notably to overcome the above-mentioned drawbacks by effectively containing the input line and the output line. To this end, the subject of the invention is an electromagnetic containment module. The module includes a metal casing sealed by a metal cover. The module contains a printed circuit arranged flat in the bottom of the casing, an input/output line leaving the printed circuit via one of its edges to pass perpendicularly through a wall of the casing. A cylinder of hollow axis is arranged on the internal face of this wall, the axis of the cylinder being substantially perpendicular to the wall and the input/output line passing through the cylinder substantially along its axis. The cover includes a notch, the bottom of which has the form of a half-cylinder of the same diameter as the cylinder, the cylinder fitting substantially without play in the notch when the cover is closed, so as to electromagnetically contain the portion of the input/output line situated in the module between the edge of the printed circuit and the wall of the casing.

In one embodiment, the printed circuit can include, on its top face, electronic components linked by transmission lines. The printed circuit can also include a metallized layer extending over its entire bottom face and a metallized layer extending over its entire top face except in the vicinity of the electronic components and the transmission lines. Metallized holes can pass through the printed circuit to electrically link the two metallized layers. The cover can include cells and channels facing the electronic components and the transmission lines, in which the components and transmission lines are respectively housed when the cover is closed. The cylinder can then fit substantially without play in the notch while enabling the cover to exert a bearing force on the printed circuit in the metallized area of its top face, so as to electromagnetically contain the electronic components and the transmission lines.

Advantageously, the printed circuit can be a multilayer circuit comprising conductive tracks on internal layers, these conductive tracks conveying power supply voltages and control signals for the electronic components. These power supply voltages and these control signals can then enter into the module via one and the same collective input connector, so as to further limit the electromagnetic leaks.

In one embodiment, the casing can include a coaxial connector arranged on the external face of the wall facing the cylinder, the central core of the connector being able to be linked to the input/output line.

For example, the printed circuit is a microwave circuit.

In one embodiment, the bearing force can be obtained by screwing the cover onto the casing. The input/output line can be a microstrip, as can the transmission lines.

The cylinder can be pressed with force into a hole drilled in the wall of the casing or machined from the body of the wall of the casing.

Other main advantages of the invention are that it makes it possible to implement the processing subsystem on a single printed circuit, the circuit consequently being able to be produced by one of the more conventional industrial processes at a reasonable cost, without introducing electrical discontinuities adversely affecting the performance characteristics of the processing subsystem.

Figure 2:
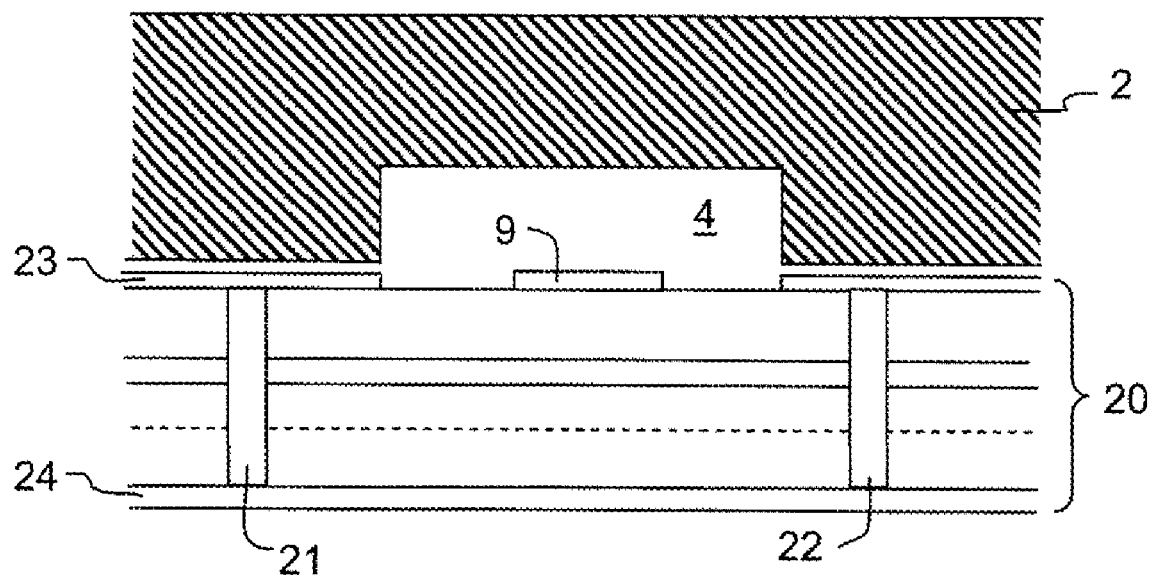
Figure 3:
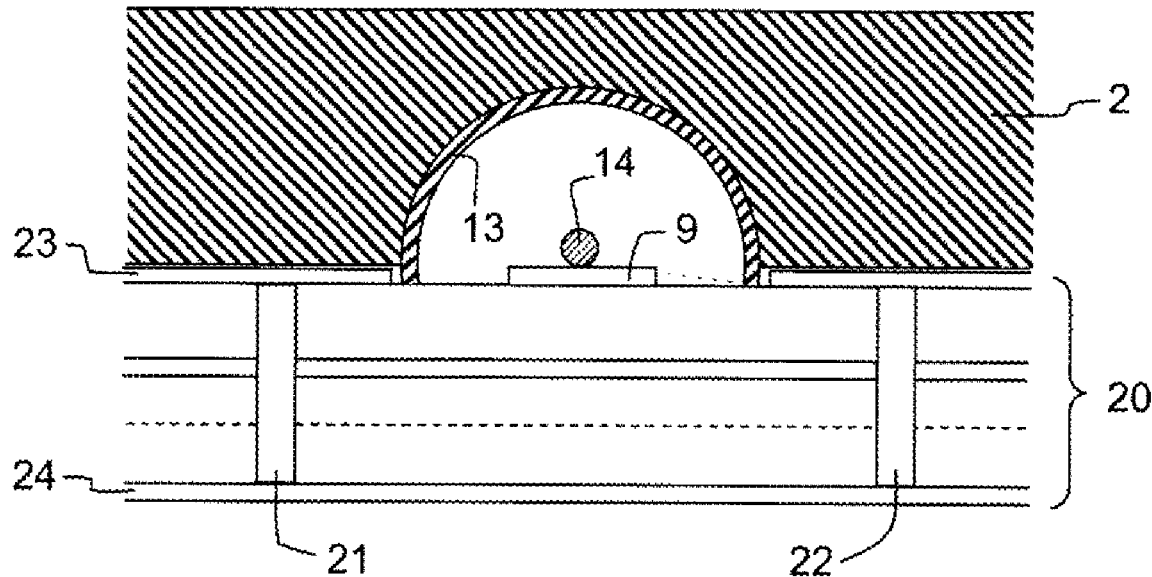

Other features and advantages of the invention will become apparent from the description that follows, given in light of the appended drawings which represent:

FIG. 1, by a cross-sectional view, an illustration of an exemplary embodiment of an electromagnetic containment module according to the present invention;

FIG. 2, by another cross-sectional view, an illustration of the same exemplary embodiment;

FIG. 3, by another cross-sectional view, an illustration of the same exemplary embodiment.

FIG. 1 uses a horizontal cross-sectional view to illustrate an exemplary embodiment of a circuit containment module according to the present invention. In this example, it concerns a microwave circuit. The module includes a casing formed by four vertical metal walls, including a wall 1, and by a horizontal metal bottom not represented in FIG. 1. The casing therefore forms a parallelepipedal receptacle open via its top face. The casing can be closed by a rectangular metal cover 2, arranged horizontally on the casing, so as to form a containment module according to an embodiment of the invention. Only the wall 1 of the casing is represented in FIG. 1, the wall 1 separating the interior and the exterior of the casing. In the exemplary embodiment of FIG. 1, the containment module contains a multilayer printed circuit 20, which is illustrated only in FIGS. 2 and 3, arranged horizontally in the bottom of the casing. The printed circuit 20 includes, for example, electronic components 5, 6, 7 and 8 interconnected to implement a microwave signal processing function. For example, the microwave signal can be received at the input of the component 5 via a microstrip 9 arranged on the printed circuit 20. For example, the printed circuit 20 can also include a microstrip 10 conveying the output signal from the component 6 after processing. Advantageously, the metal cover 2 includes a cell 3 hollowed out from the body of the cover 2 facing the components 5, 6, 7 and 8, and a channel 4 hollowed out from the body of the cover 2 facing the microstrip 9 and a channel 11 hollowed out from the body of the cover 2 facing the microstrip 10. Thus, once the casing is closed by the cover 2, the components 5, 6, 7 and 8 are advantageously housed in the cell 3, the microstrip 9 is advantageously housed in the channel 4 and the microstrip 10 is advantageously housed in the channel 11. It should be noted that the cover 2 can include other cells and other channels hollowed out from its body and spread out over its entire surface facing the components and the microstrips that can be spread out over the entire surface of the multilayer printed circuit 20.

Since the metal cover 2 includes cells and channels hollowed out from its body, it necessarily has a not-inconsiderable thickness of the order of a few millimeters. Consequently, it offers good rigidity. Thus, once the casing is sealed by the cover 2, the cover 2 being able to be fixed rigidly to the casing by screws arranged at the four corners of the cover 2 for example, the rigidity of the cover 2 advantageously enables the latter to exert a bearing force on the printed circuit 20 sealed in the containment module. Advantageously, the rigidity of the cover 2 also makes it possible for the bearing force to be exerted substantially uniformly over all of the surface of the printed circuit 20 in contact with the cover 2, that is everywhere except where a cell or a channel has been hollowed out from the body of the cover 2.

The casing can, for example, include, on the external face of its wall 1, a coaxial connector 12. The coaxial connector 12 can be screwed to the external face of the wall 1, in a hole previously drilled through the wall 1 then partly tapped. A cylindrical and hollow metal piece forming a bush 13 can then be pressed with force into the hole via the internal face of the wall 1. However, the bush 13 is pressed only partially into the hole in the wall 1, so that it extends from the hole by a few millimeters inside the casing. Thus, the coaxial connector 12 can be extended into the containment module through the bush 13, the body of which is hollow, by a conductive connection 14 corresponding to the central core of a coaxial connection. The connection 14 can be linked to the microstrip 9, so that the connector 12 advantageously enables the microwave input signal having to be processed by the components 5, 6, 7 and 8 to be brought into the containment module. The edge of the cover 2 situated inside the casing includes an accurately hollowed-out notch facing the bush 13. The bottom of the notch is in the form of a half-cylinder of the same diameter as the bush 13, to enable the bush 13 to fit substantially without play into the notch. By containing the connection 14 when the latter passes through the slot that is inevitably left between the wall 1 and the printed circuit 20, the hollow bush 13 prevents any electromagnetic leaks. It should be noted that, in a variant embodiment, the bush 13 can also be machined from the body of the casing instead of being pressed with force. An axis $C_1$ corresponds to the cross-sectional axis of FIG. 2 and an axis $C_2$ corresponds to the cross-sectional axis of FIG. 3, FIGS. 2 and 3 being detailed hereinbelow.

FIG. 2 illustrates, by a vertical cross-sectional view along the axis $C_1$, the same exemplary embodiment of a microwave containment module as FIG. 1. FIG. 2 notably illustrates the multilayer printed circuit 20 comprising the microstrip 9 inserted into the channel 4 hollowed out from the body of the metal cover 2. Advantageously, metallized holes 21 and 22 pass through the multilayer printed circuit 20, thus electrically linking a metallized layer 24 advantageously forming the bottom layer of the multilayer printed circuit 20 and a metallized layer 23 advantageously forming the top layer of the multilayer printed circuit 20. The metallized layer 24 extends over the entire surface of the multilayer printed circuit 20. The metallized layer 23 extends over the entire surface of the multilayer printed circuit 20, except in the vicinity of the electronic components, such as the components 5, 6, 7 and 8, and in the vicinity of the microstrips, such as the microstrips 9 and 10. The layers 23 and 24 are electrically linked to each other at numerous points of the multilayer printed circuit 20, by metallized holes that are identical to the metallized holes 21 and 22. The metallized layers 23 and 24 constitute microwave ground planes. The bearing force exerted by the cover 2 on the multilayer printed circuit 20 makes it possible on the one hand to establish a clear electrical contact between the layer 23 and the internal face of the cover 2, and on the other hand to establish a clear electrical contact between the layer 24 and the bottom of the casing. Thus, there is continuity of the shielding between the cells containing electronic components and between the channels containing microstrips. As for the internal layers of the multilayer printed circuit 20, they can advantageously be used to convey power supply voltages and control signals, with conductive tracks for example.

FIG. 3 illustrates, by a vertical cross-sectional view along the axis $C_2$, the same exemplary embodiment of a microwave containment module as FIGS. 1 and 2. FIG. 3 notably illustrates the multilayer printed circuit 20 comprising the two metallized layers 23 and 24 electrically linked by the metallized holes 21 and 22, and the microstrip 9 in electrical contact with the connection 14 in the hollow body of the metal bush 13 fitted substantially without play into the half-cylindrical notch hollowed out from the cover 2. It should be noted that the accuracy with which the notch is hollowed out from the internal edge of the cover 2 facing the bush 13 should not only enable the bush 13 to be fitted substantially without play into the notch, but it should also allow the cover 2 to exert an adequate bearing force on the multilayer printed circuit 20. In practice, if the notch is not sufficiently deep, then the bush 13 will rest at the bottom of the notch while the cover 2 does not bear adequately on the multilayer printed circuit 20. However, if the notch is machined accurately as illustrated by FIG. 2, then not only is the electromagnetic insulation of the components 5, 6, 7 and 9 and of the microstrips 9 and 10 assured thanks to the cover bearing adequately, but also the electromagnetic leaks are eliminated facing the coaxial connector 12 in the slot left between the wall 1 and the printed circuit 20. In practice, in the slot, the bush 13 fitted substantially without play at the bottom of the notch hollowed out at the edge of the cover 2 ensures the electromagnetic containment of the coaxial connection 14 at the point where it is linked to the microstrip 9.

In addition to a significant improvement of the electromagnetic insulation of the containment module, the embodiments of the invention described above also allow for an easy assembly of the printed circuit, which can be done industrially outside the module. It also allows for easier maintenance of the module, the latter being able to be opened easily and closed easily since there is no need for the cover to be welded. Moreover, the use of continuous microstrips limits the electrical discontinuities and the associated performance degradations. The use of conductive tracks to convey the power supply voltages and the control signals in internal layers of the printed circuit also avoids the need to drill the bottom of the casing, by providing, for example, a single collective connection of these signals at a single point of entry into the casing. This considerably simplifies the machining of the casing and further enhances the containment of the module.

The invention claimed is:

1. An electromagnetic containment module comprising:
   a metal casing having at least one lateral wall, the wall having an internal face facing an interior of the metal casing, the casing having an open top;
   a hollow cylinder formed on the internal face of the lateral wall, the hollow cylinder having an axis arranged to be substantially perpendicular to the wall;
   a metal cover sealing the top of the metal casing, the metal cover having a top surface, a bottom surface and a notch on the bottom surface, wherein the notch forms an indentation having a shape substantially corresponding to the hollow cylinder without appreciable movement when the metal cover seals the metal casing;
   a printed circuit arranged flat in the bottom of the casing, the printed circuit having one or more edges; and
   an input/output line having a first end in electrical contact with the printed circuit via one of its edges, the input/output line configured to pass perpendicularly through the wall of the metal casing,
   wherein the hollow cylinder and notch, when fitted together, electromagnetically contain a portion of the input/output line situated in the containment module between the edge of the printed circuit and the wall of the casing.

2. The module according to claim 1, wherein the printed circuit further comprises:
   a top face;
   a bottom face on a side opposite from the top face;
   one or more electronic components mounted on the top face, the one or more electronic components linked by at least a first and second transmission lines to provide at least a first and second electrical connection external to the one or more electronic components, respectively;
   a first metallized layer extending over its entire bottom face;
   a second metallized layer extending over its entire top face except in the vicinity of the one or more electronic components and in the vicinity of the first and second transmission lines; and
   one or more metallized holes passing through the printed circuit to electrically link the first and second metallized layers, and
   the cover further comprises one or more cells, each of the one or more cells having a first opening to a first channel, and a second opening to a second channel, wherein, for each of the one or more cells when the module is closed by the cover:
      the cell houses at least a portion of the one or more electronic components;
      the first channel houses the first transmission line;
      the second channel houses the second transmission line;
      the hollow cylinder fits without appreciable movement with respect to the notch to allow the cover to exert a bearing force on the printed circuit in the second metallized layer, so as to electromagnetically contain each of the one or more electronic components and each of the first and second transmission lines.

3. The module according to claim 2, wherein the printed circuit includes a multilayer circuit comprising a plurality of conductive tracks on internal layers, said conductive tracks conveying power supply voltages and control signals for the electronic components, said power supply voltages and said control signals entering into the module via a collective input connector.

4. The module according to claim 1, wherein the casing further comprises a coaxial connector arranged on an external face of the wall, the coaxial connector having a central core linked to the input/output line.

5. The module according to claim 1, wherein the printed circuit includes a microwave circuit.

6. The module according to claim 2, wherein the bearing force is obtained by screwing the cover onto the casing.

7. The module according to claim 1, wherein the input/output line includes a microstrip.

8. The module according to claim 2, wherein the first and second transmission lines include microstrips.

9. The module according to claim 1, wherein the cylinder is pressed by use of a force into a hole drilled in the wall of the casing.

10. The module according to claim 1, wherein the cylinder is machined from the body of the wall of the casing.

* * * * *